(12) United States Patent
Han et al.

(10) Patent No.: US 11,152,220 B2
(45) Date of Patent: Oct. 19, 2021

(54) ETCHING METHOD AND A SEMICONDUCTOR DEVICE

(71) Applicant: Shanghai Huali Microelectronics Corporation, Shanghai (CN)

(72) Inventors: Penggang Han, Shanghai (CN); Pengkai Xu, Shanghai (CN)

(73) Assignee: Shanghai Huali Integrated Circuit Mfg. Co. Ltd., Shanghai (CN)

(*) Notice: Subject to any disclaimer, the term of this patent is extended or adjusted under 35 U.S.C. 154(b) by 0 days.

(21) Appl. No.: 16/680,512

(22) Filed: Nov. 12, 2019

(65) Prior Publication Data

US 2020/0168470 A1 May 28, 2020

(51) Int. Cl.
| | |
|---|---|
| *H01L 21/311* | (2006.01) |
| *H01L 21/308* | (2006.01) |
| *H01L 21/3105* | (2006.01) |
| *H01L 21/3213* | (2006.01) |

(52) U.S. Cl.
CPC .... *H01L 21/31144* (2013.01); *H01L 21/3081* (2013.01); *H01L 21/31056* (2013.01); *H01L 21/32135* (2013.01)

(58) Field of Classification Search
CPC .............................................. H01L 21/31144
See application file for complete search history.

(56) References Cited

U.S. PATENT DOCUMENTS

| | | | | |
|---|---|---|---|---|
| 2012/0193713 A1* | 8/2012 | Kulkarni | ........... | H01L 29/41791 257/347 |
| 2014/0213059 A1* | 7/2014 | Doan | ................ | H01L 21/30621 438/694 |
| 2014/0349476 A1* | 11/2014 | Chen | ...................... | H01L 23/485 438/620 |
| 2018/0174966 A1* | 6/2018 | Zhu | ................... | H01L 21/76877 |
| 2018/0374712 A1* | 12/2018 | Guha | ................ | H01L 21/32137 |

* cited by examiner

*Primary Examiner* — Thomas T Pham
(74) *Attorney, Agent, or Firm* — Adsero IP

(57) ABSTRACT

The present disclosure relates to the field of semiconductor device etching process, and specifically discloses an etching method and a semiconductor device. The etching method comprises: providing a substrate on which a film layer to be etched is formed; forming a mask layer structure on the film layer to be etched, wherein the mask layer structure includes a dielectric layer formed on an upper surface of the film layer to be etched and an APF layer formed on an upper surface of the dielectric layer; patterning the APF layer; performing a first etching process on the dielectric layer and the film layer to be etched by using the patterned APF layer as a mask to pattern the dielectric layer and partially etch the film layer to be etched; removing the patterned APF layer.

18 Claims, 4 Drawing Sheets

ETCHING METHOD AND A SEMICONDUCTOR DEVICE

CROSS-REFERENCES TO RELATED APPLICATIONS

The present application claims priority to Chinese Patent Application No. 201811432033.8, filed on Nov. 28, 2018, entitled "AN ETCHING METHOD AND A SEMICONDUCTOR DEVICE", which is incorporated by reference herein for all purposes.

FIELD

The present disclosure relates to the field of semiconductor device etching process, and specifically discloses an etching method and a semiconductor device formed by the etching method.

BACKGROUND

With the constantly shrinking of the semiconductor process nodes, the importance of hard mask etching for small-sized polysilicon etching is becoming increasingly prominent. Advanced patterning film (APF) hard mask etching is widely used in polysilicon etching processes due to its excellent line edge roughness (LER) performance and high selectivity to common etched layers.

In the etching process for a flash with a novel structure, the erase gate polysilicon (EP) etching process uses APF as a hard mask to perform polysilicon etching. Due to the high step difference in the etching film layer structure, it is necessary to have a high amount of polysilicon etching in some regions. In addition, in order to protect the underlying polysilicon gate and the underlying active region, the etching process requires a high etching selectivity ratio for the silicon oxide covering the underlying polysilicon and the underlying active region.

The film layer according to the conventional erase gate etching process is from bottom to top, followed by erase gate polysilicon (EP), advanced patterning film (APF), dielectric anti reflective coating (Darc), silicon oxide cap (Cap OX), bottom anti reflective coating (Barc), and photo resist (PR). The etching process may comprise the following steps:

Step 1: simultaneous etching the Barc and the Darc with an etching gas having a low selectivity to the Barc and the Darc by using the PR after exposure and development as a mask, and ensuring a certain amount of over etching (OE), thereby transferring the pattern defined by photo resist exposure to the Barc and the Darc;

Step 2: etching the APF mask in the etched region defined in step 1 and the residual PR and the Barc in the unexposed region with an etching gas having a high selective ratio to the APF and the EP, thereby transferring the etched pattern defined in step 1 onto the APF mask;

Step 3: etching the EP in the etched region defined in step 2 with a portion of thickness and etching away the Cap OX and Darc at the top of the APF in the unexposed area with an etching gas having a low selectivity to Cap OX, Darc and EP, and retaining a certain thickness of the APF mask;

Step 4: further etching the residual EP with a gas having a high selectivity ratio to silicon oxide and the EP by using the remaining APF as a mask, and ensuring a certain amount of OE and bottom silicon oxide loss to form a final EP pattern;

Step 5: further etching to remove the residual APF mask.

Due to the high concentration of polymer generated during the etching process, after the step 4 of soft landing (SL) and OE steps of the prior EP etching process, the polymer will be enriched on the surface of the APF to form a polymer shell 8 as shown in FIG. 1. Since the polymer shell 8 cannot be removed in subsequent etching and ashing processes, it becomes a source of defects in subsequent processes.

SUMMARY

A brief overview of one or more aspects is provided below to provide a basic understanding of these aspects. The summary is not an extensive overview of all of the aspects that are contemplated, and is not intended to identify key or decisive elements in all aspects. The sole purpose of the summary is to present some concepts of one or more aspects in a simplified form as a prelude to the more detailed description that is presented later.

In order to avoid the enrichment of the polymer generated during the polysilicon etching process on the surface of the APF, thereby eliminating the defects of the polymer shell on the surface of the semiconductor device, the present disclosure provides an etching method, and a semiconductor device formed by the etching method.

The etching method provided by the present disclosure may comprise the following steps:

providing a substrate on which a film layer to be etched is formed;

forming a mask layer structure on the film layer to be etched, and the mask layer structure comprises a dielectric layer formed on an upper surface of the film layer to be etched and an advanced patterning film (APF) layer formed on an upper surface of the dielectric layer;

patterning the APF layer;

performing a first etching process on the dielectric layer and the film layer to be etched by using the patterned APF layer as a mask to pattern the dielectric layer, partially etch the film layer to be etched, and etch the dielectric anti reflective coating (Darc) on top of the APF in the unexposed area;

removing the patterned APF layer; and performing a second etching process on the film layer to be etched by using the patterned dielectric layer as a mask.

As the etching method provided by the present disclosure, preferably, the etching process parameter used in the first etching process may be different from the etching process parameter used in the second etching process; and the etching process parameter may comprise one or more of etching gas species, etching gas flow rate, etching power, etching chamber pressure, and etching temperature.

As the etching method provided by the present disclosure, preferably, the first etching process may be performed using an etching gas having a low selectivity with respect to the dielectric layer and the film layer to be etched; and the second etching process may be performed using an etching gas having a high selectivity with respect to the dielectric layer and the film layer to be etched.

As the etching method provided by the present disclosure, the second etching process may further comprise a soft landing step and an over etching step; and the etching process parameter used in the soft landing step may be different from the etching process parameter used in the over etching step.

As the etching method provided by the present disclosure, the dielectric layer formed on the surface of the film layer to be etched may have a thickness of 200-600 angstroms (Å).

As the etching method provided by the present disclosure, the mask layer structure may further comprise a dielectric anti reflective coating (Darc) and a bottom anti reflective coating (Barc) on the upper portion of the mask layer structure, and the Darc may be located between the APF layer and the Barc.

As the etching method provided by the present disclosure, preferably, patterning the APF layer may further comprise: forming a photo resist pattern on the mask layer;
etching and over etching the Darc and the Barc by the photo resist pattern to expose the APF layer;
etching the APF layer to form the patterned APF layer.

As the etching method provided by the present disclosure, the patterned APF layer may be further removed by ashing etching.

As the etching method provided by the present disclosure, the etching method may further comprise:
removing the etched dielectric layer after performing the second etching process.

As the etching method provided by the present disclosure, the substrate may further have a stepped gate dielectric formed thereon and the film layer to be etched covers the gate dielectric and the substrate; and
the film layer to be etched may be made of polysilicon to form an erase gate on the gate dielectric; and
the dielectric layer may be made of silicon oxide or silicon nitride.

According to another aspect of the present disclosure, a semiconductor device formed by any one of the above etching methods is also provided herein. There is no polymer shell on the etched region surface of the semiconductor device.

BRIEF DESCRIPTION OF THE DRAWINGS

The above features and advantages of the present disclosure will be better understood after reading the detailed description of the embodiments of the present disclosure in conjunction with the following figures. In the figures, components are not necessarily drawn to scale, and components having similar related features may have the same or similar reference numerals.

Figure 1:
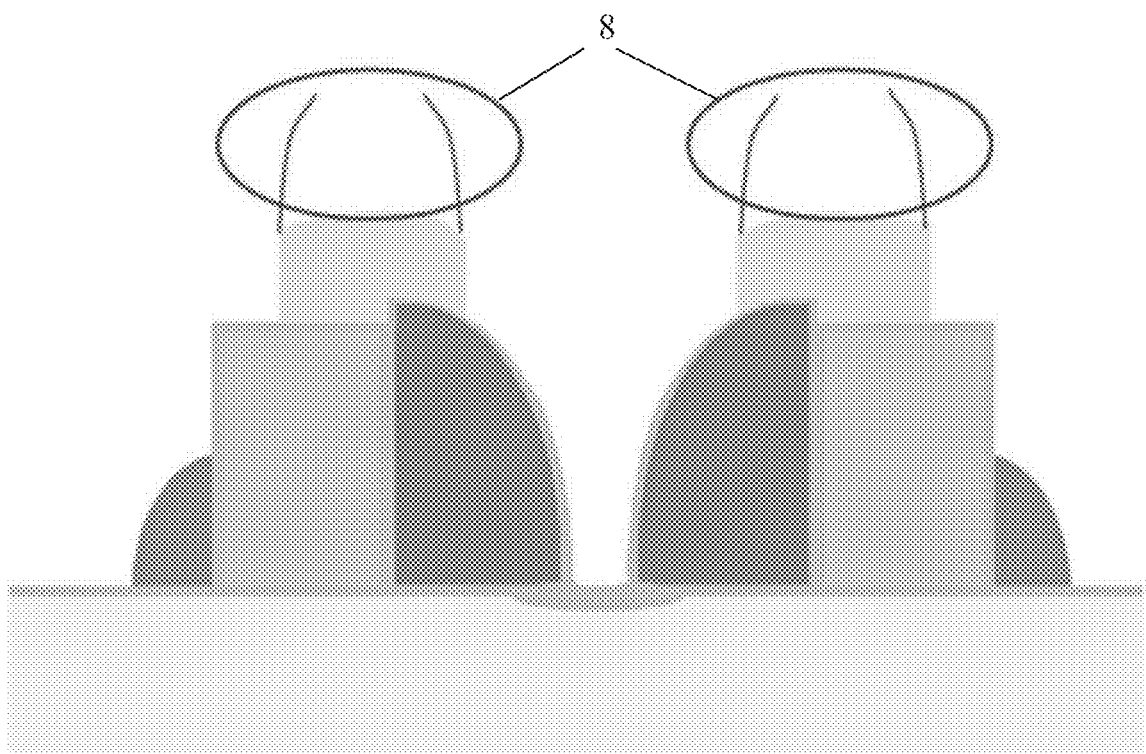
FIG. 1 shows the structure of a film layer formed by conventional erase gate etching process.

REFERENCE SIGNS 1 substrate
2 stepped gate dielectric
3 film layer to be etched
41 first dielectric layer
42 second dielectric layer
5 APF layer
61 dielectric anti reflective coating (Darc)
62 bottom anti reflective coating (Barc)
7 photo resist (PR)
8 polymer shell
91 semiconductor device to be etched
92 semiconductor device with patterned PR;
93 semiconductor device with patterned Barc and Darc 94 semiconductor device with patterned APF layer
95 semiconductor device after the first etching process
96 semiconductor device with APF layer removed
97 semiconductor device with patterned EP
98 semiconductor device after etching process
101-106 steps of the erase gate etching method
1031-1033 steps of patterning the APF layer

DETAILED DESCRIPTION

Although the description of the present disclosure will be described in conjunction with the preferred embodiments, this is not a limitation of the present disclosure. On the contrary, the disclosure is described in connection with the embodiments so as to cover other alternatives or modifications that are possible in the embodiments of the present disclosure. In order to provide a thorough understanding of the present disclosure, many specific details are included in the following description. The present disclosure may also be practiced without these details. In addition, some specific details are omitted in the description in order to avoid confusing or obscuring the present disclosure.

In the description of the present disclosure, it should be noted that the terms "installation", "connecting", and "connected" should be understood broadly unless explicitly stated and defined otherwise. For example, the terms "installation", "connecting", and "connected" may be either a fixed connection, a detachable connection, or an integral connection; the terms may be either a mechanical connection or an electrical connection; the terms also may be either a direct connection, an indirect connection through an intermediate medium, or an internal connection between two components.

In addition, "up", "down", "left", "right", "top", "bottom", "horizontal", "vertical" used in the following description shall be understood as the orientation described in the paragraph and shown in the related figure. The relative term is used for convenience of description only, and does not mean that the device described therein is to be manufactured or operated in the specific orientation, and therefore should not be construed as limiting the present disclosure.

Understandably, although the terms "first", "second", "third", etc. may be used to describe various components, regions, layers and/or portions to distinguish different components, regions, layers and/or portions, the order of these components, regions, layers and/or portions described above should not be limited by the terms. Therefore, a first component, region, layer and/or portion mentioned below may be also mentioned as a second component, region, layer and/or portion without departing from some embodiments of the present disclosure.

Although the method is illustrated and described as a series of actions for the purpose of simplifying the explanation, it should be understood and appreciated that these methods are not limited by the order of the actions.

In order to avoid the enrichment of the polymer generated during the polysilicon etching process on the surface of the APF, thereby eliminating the defects of the polymer shell on the surface of the semiconductor device, the present disclosure provides an embodiment of an etching method, and an embodiment of a semiconductor device formed by the etching method.

Figure 2:
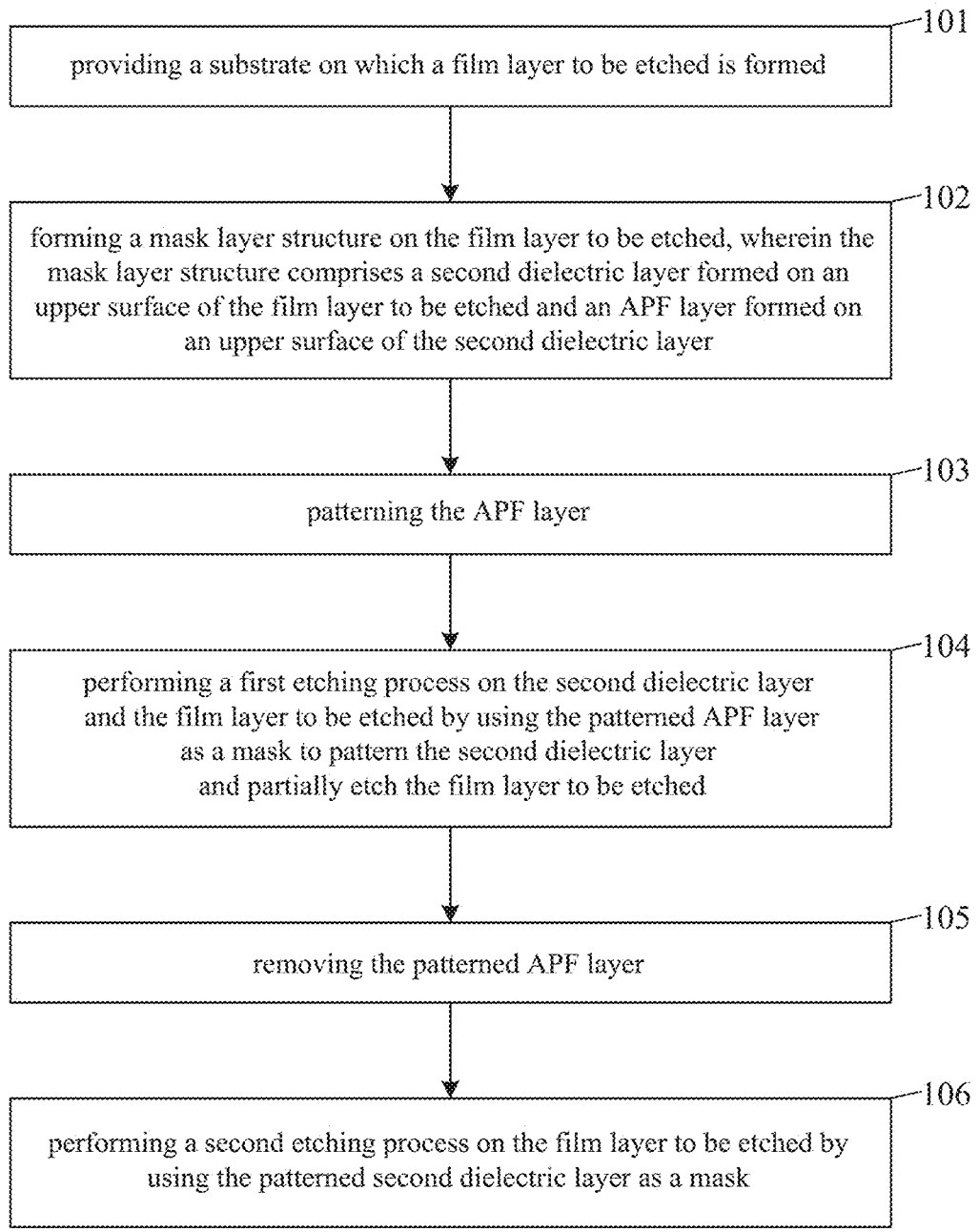
FIG. 2 shows the steps of an erase gate etching process according to an embodiment of the present disclosure.

As shown in FIG. 2, the etching method according to the embodiment may comprise the following steps:
101: providing a substrate 1 on which a film layer 3 to be etched is formed;

102: forming a mask layer structure on the film layer to be etched 3, and the mask layer structure comprises a second dielectric layer 42 formed on an upper surface of the film layer 3 to be etched and an advanced patterning film (APF) layer 5 formed on an upper surface of the second dielectric layer 42;

103: patterning the APF layer 5;

104: performing a first etching process on the second dielectric layer 42 and the film layer 3 to be etched by using the patterned APF layer 5 as a mask to pattern the second dielectric layer 42, and partially etch the film layer to be etched 3;

105: removing the patterned APF layer 5; and

106: performing a second etching process on the film layer to be etched 3 by using the patterned second dielectric layer 42 as a mask.

Regarding the etching method according to the embodiment, step 101 is primarily a preparation step of the etching method. The substrate 1 may be a silicon (Si) substrate. The film layer 3 to be etched may be a polysilicon film layer covering the substrate 1 by a process such as spraying or spin coating.

Figure 3:
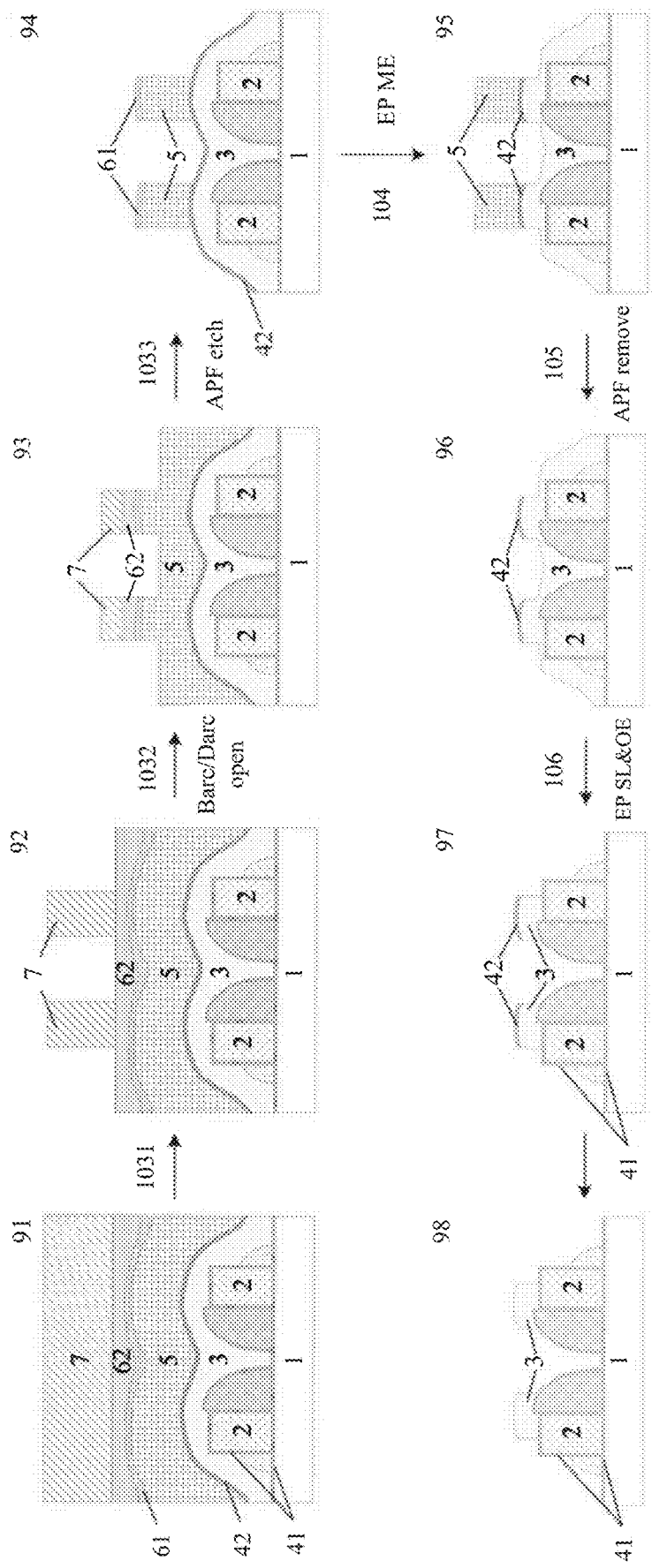
FIG. 3 shows the device structures at various stages of an erase gate etching method according to an embodiment of the present disclosure.

As shown in FIG. 3, it is also possible to provide a stepped gate dielectric 2 on the silicon substrate 1 depending on the actual function of the semiconductor device. The film layer 3 to be etched that is made of polysilicon may cover the gate dielectric 2 and the substrate 1 to form an erase gate polysilicon (EP) on the gate dielectric 2.

The outer surface of the silicon substrate 1 and the gate dielectric 2 may be further coated with a first dielectric layer 41 to protect the silicon substrate 1 and the gate dielectric 2. The first dielectric layer 41 may be a silicon dioxide ($SiO_2$) or silicon nitride ($Si_3N_4$) film layer that has a selectivity ratio to polysilicon.

In one embodiment, the silicon substrate 1 and the polysilicon film layer 3 to be etched are just a specific combination provided by the embodiment. In other embodiments, the substrate 1 may also be made of various materials such as sapphire ($Al_2O_3$), silicon carbide (SiC) or the like according to the actual requirements of the semiconductor device. The material of the substrate 1 and the material of the film layer 3 to be etched may be arbitrarily combined according to the actual requirements of the semiconductor device.

Correspondingly, the method for forming the film layer 3 to be etched may further comprise one or more of the processes of spraying, spin coating, vapor deposition, electroplating, deposition, etc., which are suitable for the material properties of the film layer to be etched 3. The first dielectric layer 41 may further comprise a film layer of other materials that have a selection ratio to the material of the film layer to be etched 3.

In one embodiment, the stepped gate dielectric 2 is just an embodiment of the semiconductor device according to the actual function. In other embodiments, the silicon substrate 1 may also be provided with other semiconductor structures thereon in accordance with the actual function of the semiconductor device without departing from the etching method concept of the present disclosure.

Regarding the etching method according to the embodiment, step 102 is also primarily a preparation step of the etching method. The mask layer may comprise a second dielectric layer 42 and an advanced patterning film (APF) layer 5.

The second dielectric layer 42 may be a silicon dioxide ($SiO_2$) or silicon nitride ($Si_3N_4$) film layer formed on the upper surface of the film layer 3 to be etched that has a selectivity ratio to polysilicon.

The APF layer 5 may serve as a hard mask in the etching method. The APF layer 5 may be formed on the upper surface of the second dielectric layer 42 by one or more of processes such as spraying, spin coating, evaporation, plating, deposition, and the like that are suitable for the specific material properties.

Regarding the etching method according to the embodiment, step 103 is primarily used to transfer the specific pattern of the desired erase gate 2 to the APF layer 5. The step of patterning the APF layer 5 may be carried out by photolithography that uses photo resist (PR) 7.

Corresponding to the photolithography method, the mask layer may further comprise a dielectric anti reflective coating (Darc) 61 and a bottom anti reflective coating (Barc) 62 on the upper portion of the mask layer structure, used to absorb the reflected light generated during exposure and development, and to reduce problems such as standing waves. The Darc 61 may be located between the APF layer 5 and the Barc 62.

As shown in FIG. 3, correspondingly, an film layer of the semiconductor device 91 to be etched according to the erase gate etching process may be obtained through the preparation of steps 101 and 102. The preferred film layer of the erase gate etching process comprises from bottom to top, polysilicon film layer 3 to be etched having a thickness of 800 Å, second dielectric layer 42 having a thickness of 200 Å, APF layer 5 having a thickness of 2800 Å, Darc 61 having a thickness of 350 Å, and Barc 62 having a thickness of 800 Å. A silicon oxide cap (Cap OX) (not shown in FIG. 3) having a thickness of 50 Å may also be present between the Darc 61 and the Barc 62.

Figure 4:
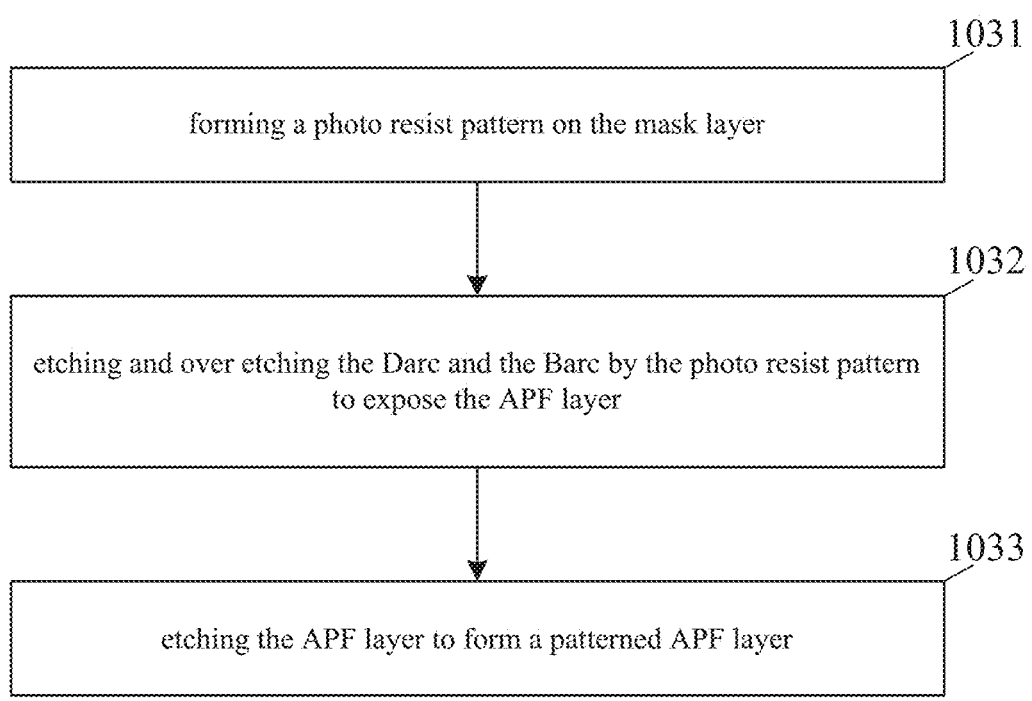
FIG. 4 shows the steps of patterning the APF layer according to an embodiment of the present disclosure.

As shown in FIG. 4, the step of patterning the APF layer 5 may further comprise the following steps:

1031: forming a PR 7 pattern on the mask layer;

1032: etching and over etching the Darc 61 and the Barc 62 by the PR 7 pattern to expose the APF layer 5; and 1033: etching the APF layer 5 to form a patterned APF layer 5.

The PR 7 pattern formed in step 1031 may be obtained by covering a specific region of the PR 7 with a mask having a corresponding pattern, and then performing exposure and development to remove the PR 7 in the uncovered region.

As shown in FIG. 3, the semiconductor device 92 with patterned PR may be obtained by exposure and development. The patterned PR 7 on the semiconductor device 92 is in the shape of the desired erase gate polysilicon (EP) pattern. The area covered by the patterned PR 7 may be defined as an unexposed area, and the area not covered by the patterned PR 7 may be defined as an etched area.

In step 1032, the patterned PR 7 obtained by exposure and development may be used as a mask to simultaneously etch the Darc 61 and the Barc 62 with an etching gas having a low selection ratio to the Darc 61 and the Barc 62 (for example, $CF_4$ or a combination of etching gas mainly based on $CF_4$), and ensure a certain amount of over etching (OE). Thereby, the shape of the desired EP pattern defined by the patterned PR 7 exposure may be transferred to the Darc 61 and the Barc 62 to obtain the semiconductor device 93 with patterned Barc and Darc, and expose the APF layer 5 in the etched region.

In step 1033, the APF layer 5 in the etched region may be etched with an etching gas (for example, $SO_2$ and $O_2$) having a high selectivity ratio to the APF layer 5 and the polysilicon film layer 3 to be etched to completely etch away all of the APF layer 5 on the upper portion of the second dielectric layer 42 in the etched region, and simultaneously etch away the residual PR and the Barc 62 in the unexposed area, thereby obtaining the semiconductor device 94 with patterned APF layer and transferring the etching pattern to the APF layer 5.

In one embodiment, the specific method for transferring the shape of EP to the APF layer 5 by photolithography with PR 7 is just a specific embodiment. In other embodiments, the APF layer 5 may also be patterned into the desired shape by other means.

Corresponding to the embodiment that does not use photolithography to pattern the APF layer 5, the film layer of the erase gate etching process in the semiconductor device 91 to be etched may not comprise the Darc 61, the Barc 62, and the Cap OX located between the Darc 61 and the Barc 62.

In one embodiment, the specific thickness of each layer provided in the preferred film layer of the erase gate etching process in the semiconductor device 91 to be etched is a specific combination provided in the embodiment. In other embodiments, the thickness of each layer in the film layer of the erase gate etching process may also be appropriately changed according to the actual functional requirements of the semiconductor device.

Regarding the etching method according to the embodiment, the step 104 is mainly used to pattern the second dielectric layer 42 and partially etch the polysilicon film layer 3 to be etched.

The first etching process may be performed with an etching gas having a low selectivity with respect to the second dielectric layer 42 and the film layer 3 to be etched (for example, $CF_4$ or a combination of etching gas mainly based on $CF_4$). The etching process parameters may be specifically: an etching gas flow rate of 60-100 sccm (standard cubic centimeters per minute), an etching power of 500-900 W (watt), an etching chamber pressure of 5-10 mT (millitorr) and an etching temperature of 40-60° C.

The first etching process may simultaneously etch away the second dielectric layer 42 and a portion of thickness of the polysilicon film layer 3 to be etched in the etched region, and retain a certain thickness of the APF layer 5, thereby obtaining the semiconductor device 95 after the first etching process. The first etching process performs a main etching (ME) on the polysilicon film layer 3 to be etched to substantially form a desired pattern.

The first dielectric layer 41 and the second dielectric layer 42 may be formed by different materials in order to reduce the damage to the first dielectric layer 41 as much as possible when the second dielectric layer 42 is removed, thereby protecting the semiconductor device.

The thickness of the second dielectric layer 42 may be 200-600 Å. In one embodiment, the second dielectric layer 42 may have a thickness of 400 Å to better protect the polysilicon film layer 3 to be etched in the unexposed regions and to improve the etching efficiency in step 104.

In one embodiment, the etching gas having a low selectivity with respect to the second dielectric layer 42 and the polysilicon film layer 3 to be etched is a just specific embodiment. In an embodiment corresponding to patterning the APF layer 5 by photolithography, an etching gas having a low selectivity ratio with respect to the Cap OX, the Darc 61, the second dielectric layer 42 and the polysilicon film layer 3 to be etched may also be employed in step 104 to simultaneously etch the second dielectric layer 42 and the polysilicon film layer 3 to be etched in the etched region. Meanwhile, the Cap OX and the Darc 61 at the top the APF layer 5 in the unexposed area may be etched away, and a certain thickness of the APF layer 5 may be retained.

Regarding the etching method according to the embodiment, step 105 is mainly used to remove the patterned APF layer 5. The patterned APF layer 5 may be removed by in-situ etching to obtain the semiconductor device 96 with the APF layer removed.

Regarding the etching method according to the embodiment, step 106 is primarily used to form the pattern of the final erase gate polysilicon.

The second etching process may employ etching process parameters that are different from the first etching process. The etching process parameters may comprise one or more of etching gas species, etching gas flow rate, etching power, etching chamber pressure and etching temperature.

The second etching process may comprise a soft landing step and an over etching (OE) step, and the etching process parameters employed in the soft landing step may be different from the etch process parameters employed in the OE step.

The second etching process may be performed with an etching gas having a high selectivity with respect to the second dielectric layer 42 and the polysilicon film layer 3 to be etched (for example, $HBr/O_2$). The etching process parameters may be specifically: an HBr flow rate of 100-300 sccm, an $O_2$ flow rate of 2-4 sccm, an etching power of 500-900 W, an etching chamber pressure of 6-10 mT and an etching temperature of 40-60° C.

The second etching process may perform further etching on the remained polysilicon film layer 3 to be etched in the etched region to ensure a certain amount of OE on the polysilicon film layer 3 to be etched, and a certain loss formed to the first dielectric layer 41, thereby obtaining the semiconductor device 97 with the pattern of the final EP.

In one embodiment, the first etching process and the second etching process using different etching process parameters are just specific embodiments. In other embodiments, the specific etching process parameters of the first etching process and the second etching process may also be determined according to the specific materials and thickness of the film layer 3 to be etched, the second dielectric layer 42 and the APF layer 5.

In one embodiment, performing the second etching process with the etching gas having a high selectivity with respect to the second dielectric layer 42 and the polysilicon film layer 3 to be etched is an embodiment to improve the efficiency and effects of the second etching process.

In other embodiments, the basic effect of etching may also be achieved without using the etching gas having a high selectivity with respect to the second dielectric layer 42 and the polysilicon film layer 3 to be etched.

The etching method provided by the embodiment may further comprise the step:

further removing the second dielectric layer 42 in the etched region after performing the second etching process of step 106 to obtain the semiconductor device 98 after etching process without the second dielectric layer 42.

In one embodiment, the step of removing the second dielectric layer 42 in the etched region is just an embodiment. In other embodiments, the second dielectric layer 42 may also be retained if the presence of the second dielectric layer 42 does not affect the normal operation of the semiconductor device 98 after etching process.

Based on the above description, the etching method according to the embodiment avoid the problem of polymer enrichment on the surface of APF in the prior art, and eliminate the defects of the polymer shell on the surface of the semiconductor device by forming a second dielectric layer 42 on the surface of the polysilicon film layer 3 to be etched; further removing the APF layer 5 after the main etching step of the polysilicon (step 104); and further etching the polysilicon by using the added second dielectric layer 42 as a mask.

According to another aspect of the present disclosure, an embodiment of a semiconductor device formed by any one of the above etching methods is also provided herein.

As seen from the semiconductor device 98 after etching process shown in FIG. 3, there is no polymer shell on the etched region surface of the semiconductor device, thereby eliminating the source of defects in subsequent processes.

In one embodiment, the semiconductor device having a stepped gate dielectric 2 and stepped EP is just a specific embodiment. In other embodiments, the semiconductor device may also have a variety of other functional structures depending on the actual functional requirements.

What is claimed is:

1. An etching method, comprising:
   providing a substrate;
   providing a stepped gate dielectric on the substrate;
   providing a first dielectric layer on the gate dielectric and the substrate;
   providing a film layer to be etched on the first dielectric layer;
   forming a mask layer structure on the film layer to be etched, wherein the mask layer structure comprises a second dielectric layer formed on an upper surface of the film layer to be etched and an amorphous carbon hard mask film layer formed on an upper surface of the second dielectric layer;
   patterning the amorphous carbon hard mask film layer;
   performing a first etching process on the second dielectric layer and the film layer to be etched by using the patterned amorphous carbon hard mask film layer as a mask to pattern the second dielectric layer and partially etch the film layer to be etched;
   removing the patterned amorphous carbon hard mask film layer; and
   performing a second etching process on the film layer to be etched by using the patterned second dielectric layer as a mask;
   wherein a first etching process parameter used in the first etching process is different from a second etching process parameter used in the second etching process; wherein
   the first and second etching process parameter comprises one or more of etching gas species, etching gas flow rate, etching power, etching chamber pressure, and etching temperature.

2. The etching method of claim 1, wherein the first etching process is performed using a first etching gas comprising $CF_4$; and
   the second etching process is performed using a second etching gas comprising $HBr/O_2$.

3. The etching method of claim 2, wherein the second etching process further comprises an over etching step.

4. The etching method of claim 1, wherein the second dielectric layer formed on the surface of the film layer to be etched has a thickness of 200 to 600 angstroms.

5. The etching method of claim 1, wherein the mask layer structure further comprises a dielectric anti reflective coating (Darc) and a bottom anti reflective coating (Barc) on the upper portion of the mask layer structure, wherein the Darc is located between the amorphous carbon hard mask film layer and the Barc.

6. The etching method of claim 5, wherein patterning the amorphous carbon hard mask film layer further comprises:
   forming a photo resist pattern on the mask layer structure;
   etching and over etching the Darc and the Barc by the photo resist pattern using the first etching gas to expose the amorphous carbon hard mask film layer; and
   etching the amorphous carbon hard mask film layer using a third etching gas to form the patterned amorphous carbon hard mask film layer;
   wherein the third etching gas comprises $SO_2$ and $O_2$.

7. The etching method of claim 5, wherein the mask layer structure further comprises a silicon oxide cap (Cap OX) between the Darc and the Barc.

8. The etching method of claim 1, wherein the patterned amorphous carbon hard mask film layer is removed by ashing etching.

9. The etching method of claim 1, further comprising:
   removing the etched second dielectric layer after performing the second etching process.

10. The etching method of claim 1, wherein
    the film layer to be etched is made of polysilicon to form an erase gate on the gate dielectric; and
    the first dielectric layer and the second dielectric layer is made of silicon oxide or silicon nitride.

11. The etching method of claim 2, wherein the first etching process parameter comprises: an etching gas flow rate of 60-100 sccm (standard cubic centimeters per minute), an etching power of 500-900 watt, an etching chamber pressure of 5-10 mT (millitorr) and an etching temperature of 40-60° C.

12. The etching method of claim 2, wherein the second etching process parameter comprises: an HBr flow rate of 100-300 sccm (standard cubic centimeters per minute), an 02 flow rate of 2-4 sccm, an etching power of 500-900 watt, an etching chamber pressure of 6-10 mT (millitorr) and an etching temperature of 40-60° C.

13. The etching method of claim 1, wherein the first dielectric layer and the second dielectric layer are formed by different materials.

14. An etching method, comprising:
    providing a substrate;
    providing a stepped gate dielectric on the substrate;
    providing a first dielectric layer on the gate dielectric and the substrate;
    providing a film layer to be etched on the first dielectric layer;
    forming a mask layer structure on the film layer to be etched, wherein the mask layer structure comprises a second dielectric layer formed on an upper surface of the film layer to be etched and an amorphous carbon hard mask film layer formed on an upper surface of the second dielectric layer;
    patterning the amorphous carbon hard mask film layer;
    performing a first etching process on the second dielectric layer and the film layer to be etched by using the patterned amorphous carbon hard mask film layer as a mask to pattern the second dielectric layer and partially etch the film layer to be etched;
    removing the patterned amorphous carbon hard mask film layer; and
    performing a second etching process on the film layer to be etched by using the patterned second dielectric layer as a mask;
    wherein the second dielectric layer formed on the surface of the film layer to be etched has a thickness of 200 to 600 angstroms.

15. The etching method of claim 14, wherein the first etching process is performed using a first etching gas comprising $CF_4$; and the second etching process is performed using a second etching gas comprising HBr/O$_2$.

16. The etching method of claim 14, wherein the second etching process further comprises an over etching step.

17. An etching method, comprising:
   providing a substrate;
   providing a stepped gate dielectric on the substrate;
   providing a first dielectric layer on the gate dielectric and the substrate;
   providing a film layer to be etched on the first dielectric layer;
   forming a mask layer structure on the film layer to be etched, wherein the mask layer structure comprises a second dielectric layer formed on an upper surface of the film layer to be etched and an amorphous carbon hard mask film layer formed on an upper surface of the second dielectric layer;
   patterning the amorphous carbon hard mask film layer;
   performing a first etching process on the second dielectric layer and the film layer to be etched by using the patterned amorphous carbon hard mask film layer as a mask to pattern the second dielectric layer and partially etch the film layer to be etched;
   removing the patterned amorphous carbon hard mask film layer; and
   performing a second etching process on the film layer to be etched by using the patterned second dielectric layer as a mask;
   wherein the film layer to be etched is made of polysilicon to form an erase gate on the gate dielectric; and
   wherein the first dielectric layer and the second dielectric layer is made of silicon oxide or silicon nitride.

18. The etching method of claim 17, wherein the mask layer structure further comprises a dielectric anti reflective coating (Darc) and a bottom anti reflective coating (Barc) on the upper portion of the mask layer structure, wherein the Darc is located between the amorphous carbon hard mask film layer and the Barc, wherein patterning the amorphous carbon hard mask film layer further comprises:
   forming a photo resist pattern on the mask layer structure;
   etching and over etching the Darc and the Barc by the photo resist pattern using the first etching gas to expose the amorphous carbon hard mask film layer; and
   etching the amorphous carbon hard mask film layer using a third etching gas to form the patterned amorphous carbon hard mask film layer;
   wherein the third etching gas comprises SO$_2$ and O$_2$.

* * * * *